US008499135B2

(12) United States Patent
Ebisuzaki

(10) Patent No.: US 8,499,135 B2
(45) Date of Patent: Jul. 30, 2013

(54) MEMORY CONTROLLER FOR READING DATA STORED IN MEMORY AFTER WRITTEN THERETO USING WRITE INFORMATION TABLE

(75) Inventor: Koji Ebisuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 826 days.

(21) Appl. No.: 12/230,020

(22) Filed: Aug. 21, 2008

(65) Prior Publication Data

US 2008/0320270 A1 Dec. 25, 2008

Related U.S. Application Data

(63) Continuation of application No. PCT/JP2006/303486, filed on Feb. 24, 2006.

(51) Int. Cl.
*G06F 12/00* (2006.01)

(52) U.S. Cl.
USPC ............ 711/168; 711/202; 711/150; 711/151

(58) Field of Classification Search
USPC ................................. 711/150, 151, 202, 168
See application file for complete search history.

(56) References Cited

U.S. PATENT DOCUMENTS 6,259,648 B1 * 7/2001 Kragick .................. 365/230.05
2004/0186946 A1 * 9/2004 Lee .............................. 711/103
2005/0097256 A1 * 5/2005 Jones ........................... 710/316
2006/0087893 A1 * 4/2006 Nishihara et al. ........ 365/189.01
2007/0156998 A1 * 7/2007 Gorobets ...................... 711/170

FOREIGN PATENT DOCUMENTS

| | | |
|---|---|---|
| JP | 59-231627 | 12/1984 |
| JP | 3-152651 | 6/1991 |
| JP | 7-253920 | 10/1995 |
| JP | 2005-258485 | 9/2005 |

OTHER PUBLICATIONS

International Search Report mailed Aug. 15, 2006 in connection with International Application No. PCT/JP2006/303486.

* cited by examiner

*Primary Examiner* — Reginald Bragdon
*Assistant Examiner* — Gurtej Bansal
(74) *Attorney, Agent, or Firm* — Fujitsu Patent Center

(57) ABSTRACT

In a data read-and-write controlling device, without waiting for confirmation that data is written in a RAM, data is written in a WER and an ADR, and at the same time, address information of the data is written in the RAM write-information table. That is, the data read-and-write controlling device associates an address retained at a data register of a write controlling unit with the value (a write request is present="1") of a write request that makes a request for writing data in the RAM, the value being retained in a write request register, and then causes the result to be stored in the RAM write-information table as the address information.

8 Claims, 11 Drawing Sheets

FIG.5

| REQUEST | | | RETURN VALUE | | | | |
|---|---|---|---|---|---|---|---|
| WCTL0 | WCTL1 | WCTL2 | WCTL0 | WCTL1 | WCTL2 | EN | DIN |
| 0 | 0 | 0 | - | - | - | 0 | - |
| 1 | 0 | 0 | DOUT | - | - | 1 | DOUT+1 |
| 0 | 1 | 0 | - | DOUT | - | 1 | DOUT+1 |
| 1 | 1 | 0 | DOUT | DOUT+1 | - | 1 | DOUT+2 |
| 0 | 0 | 1 | - | - | DOUT | 1 | DOUT+1 |
| 1 | 0 | 1 | DOUT | - | DOUT+1 | 1 | DOUT+2 |
| 0 | 1 | 1 | - | DOUT | DOUT+1 | 1 | DOUT+2 |
| 1 | 1 | 1 | DOUT | DOUT+1 | DOUT+2 | 1 | DOUT+3 |

FIG.6

| REQUEST NUMBER OF REQUEST LASTLY OBTAINING ACCESS RIGHT TO RAM | PRIORITY |
|---|---|
| 0 | 1→2→3→0 |
| 1 | 2→3→0→1 |
| 2 | 3→0→1→2 |
| 3 | 0→1→2→3 |

MEMORY CONTROLLER FOR READING DATA STORED IN MEMORY AFTER WRITTEN THERETO USING WRITE INFORMATION TABLE

CROSS REFERENCE TO RELATED PATENT APPLICATION

This application is a continuing application, filed under 35 U.S.C. §111(a), of International Application PCT/JP2006/303486, filed Feb. 24, 2006, the disclosure of which is incorporated herein by reference.

BACKGROUND OF THE INVENTION

1. Field of the Invention

The present invention relates to a data read-and-write controlling device that writes data in a storage unit and writes address information of the data in a table, and reads data from the storage unit by referring to the address information written in the table.

2. Description of the Related Art

In recent years, in RAM read-and-write controlling device, a single-port RAM using a common address port at the time of writing and reading has been used. See for example Japanese Patent Application Laid-open Publication No. 2005-258485. Such a conventional RAM read-and-write controlling device confirms that data is written in a RAM, and then writes, in a table, address information indicative of an address of data written in the RAM. The RAM read-and-write controlling device then reads the written address information, and by referring to the read address information, reads the data from the RAM.

A conventional RAM read-and-write controlling device is specifically explained below by using FIGS. 10 to 13. FIG. 10 is a block diagram of the structure of the conventional read-and-write controlling device. FIG. 11 is a structural diagram of a RAM write-information table included in the conventional RAM read-and-write controlling device. FIG. 12 is a time chart of a process flow of the conventional RAM read-and-write controlling device when data is input to a write controlling unit (WCTL0 ). FIG. 13 is a time chart of a process flow of the conventional RAM read-and-write controlling device when data is simultaneously input to a plurality of write controlling units (WCTL0 and WCTL1).

First, by using FIG. 10, the process of writing address information in a table is explained. As depicted in FIG. 10, the conventional data read-and-write controlling device includes a plurality of registers, such as S30, WA_S30, and WREQ, in a write controlling unit (WCTL). These registers retain various pieces of information for writing in the RAM. Such data can be data to be written in the RAM, an address indicative of a location where the data is written, and write request information (WREQ) for making a request for writing data.

The conventional data read-and-write controlling device also includes a plurality of registers between the RAM and the write controlling unit for temporarily storing various pieces of information before that information is stored in the RAM. Such registers include a write data register (WDR), an address data register (ADR), a write enable register (WER), and a clock-enable register (CER). The information that is stored in these registers includes data, address, write-enable information (WE), and clock-enable information (CE).

In the conventional data read-and-write controlling device, the write controlling unit notifies an arbitrating circuit of data write request information (for example, WREQ=1). When an access right from the arbitrating circuit to the RAM is assigned to the write controlling unit that issued a write request, data and addresses stored in registers S30 and WA_S30 (for example, data "HD+4B" and an address "0") are written in the relevant registers (WDR and ADR). Then, the conventional data read-and-write controlling device refers to the information (AD, WE, and CE) stored in the respective registers (ADR, WER, and CER) to write the address information in a RAM write-information table.

The conventional RAM write-information table is explained in detail below by using FIG. 11. As explained above, by referring to the information stored in the registers (ADR, WER, and CER), the conventional RAM write-information table writes the address information in the RAM write-information table.

That is, in the conventional data read-and-write controlling device, as depicted in FIG. 11, when the RAM is accessed (CE="1"), the address stored in ADR is input to a decoder in the table. Also, when a value of CE (CE=1) stored in CER is input, an enable signal of a register in a target table becomes EN="1" with logical multiplication.

Then, in the conventional data read-and-write controlling device, the value of WE stored in WER ("1" for write and "0" for read) when EN="1" is obtained is input to a register in the table. The input value of WE is then associated with an address stored in the decoder. The result is then stored as address information (for example, [0]="1") in the register.

Next, by using FIGS. 12 and 13, process timing of the conventional RAM write-information table is explained. Specifically, process timing explained below is from the time when, after the conventional RAM write-and-read controlling device confirms that data is written in the RAM (that is, the values of WE and CE become "1"), the address information indicative of an address of the data to be written in the RAM is written in the table to the time when the data is read from the RAM by referring to the read address information.

That is, as depicted in FIG. 12, the conventional RAM read-and-write controlling device retains data (HD+4B) in WDR, and retains the value of WAS30 (="0") in ADR. After the values of WE and CE are changed to "1", ADR="0", "WE"="1", and CE="1" stored in WER and CER are input to the RAM write-information table, with the address information being changed to table "0"="1".

Then, the conventional RAM read-and-write controlling device reads the address information (table "0"="1") stored in the RAM write-information table, and reads the data from the RAM by referring to the address information.

FIG. 13 depicts the process when data is simultaneously input to a plurality of write controlling units (WCTL0 and WCTL1). As with FIG. 12, after it is confirmed that data is written in the RAM, address information indicative of an address of the data written in the RAM is written in a table.

However, in the conventional technology, address information is not written until it is confirmed that data is written in the RAM. Because the data is not read from the RAM until the address information is written, it leads to greatly lowering the latency.

SUMMARY OF THE INVENTION

It is an object of the present invention to at least partially solve the problems in the conventional technology.

According to an aspect of the present invention, there is provided a data read-and-write controlling device that writes data in a storage unit and also writes address information of the data in a table, and reads the data from the storage unit by referring to the address information written in the table. The data read-and-write controlling device includes an address-information writing unit that writes the address information of the data in the table based on a write request for writing data in the storage unit; and a data reading unit that reads the data from the storage unit by referring to the address information immediately after the address information is written in the table by the address-information writing unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a drawing for explaining an operation example of the address managing unit;

FIG. 6 is a drawing for explaining an operation example of an arbitrating circuit shown in FIG. 1;

DETAILED DESCRIPTION OF THE PREFERRED EMBODIMENTS

Exemplary embodiments of the present invention are explained in detail below.

In the following, general outlines and features, structure, and a process flow of a data read-and-write controlling device 10 according to a first embodiment of the present invention are sequentially explained and, lastly, effects of the first embodiment are explained.

Figure 1:
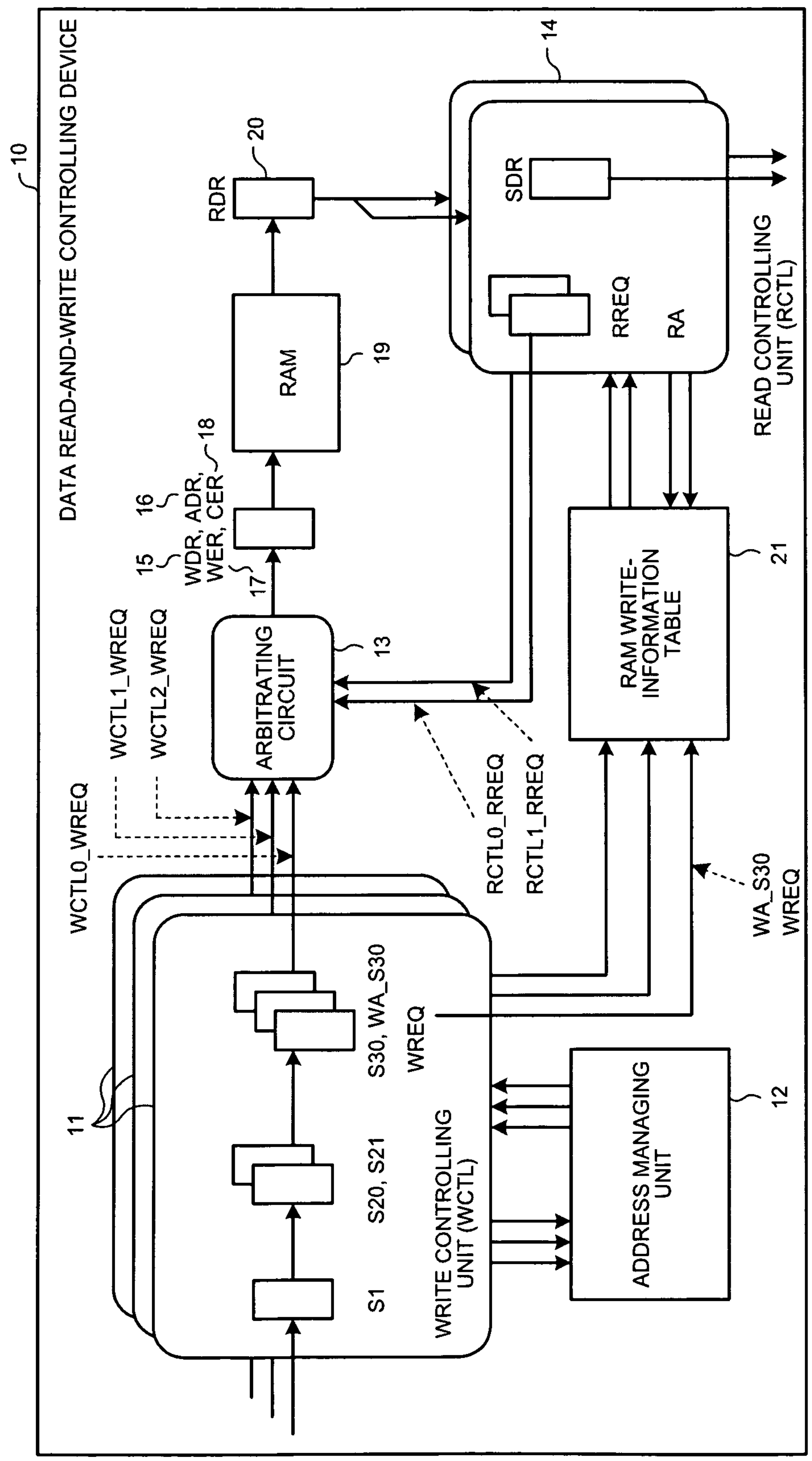
FIG. 1 is a block diagram of the structure of a data read-and-write controlling device according to a first embodiment of the present invention.
Figure 2:
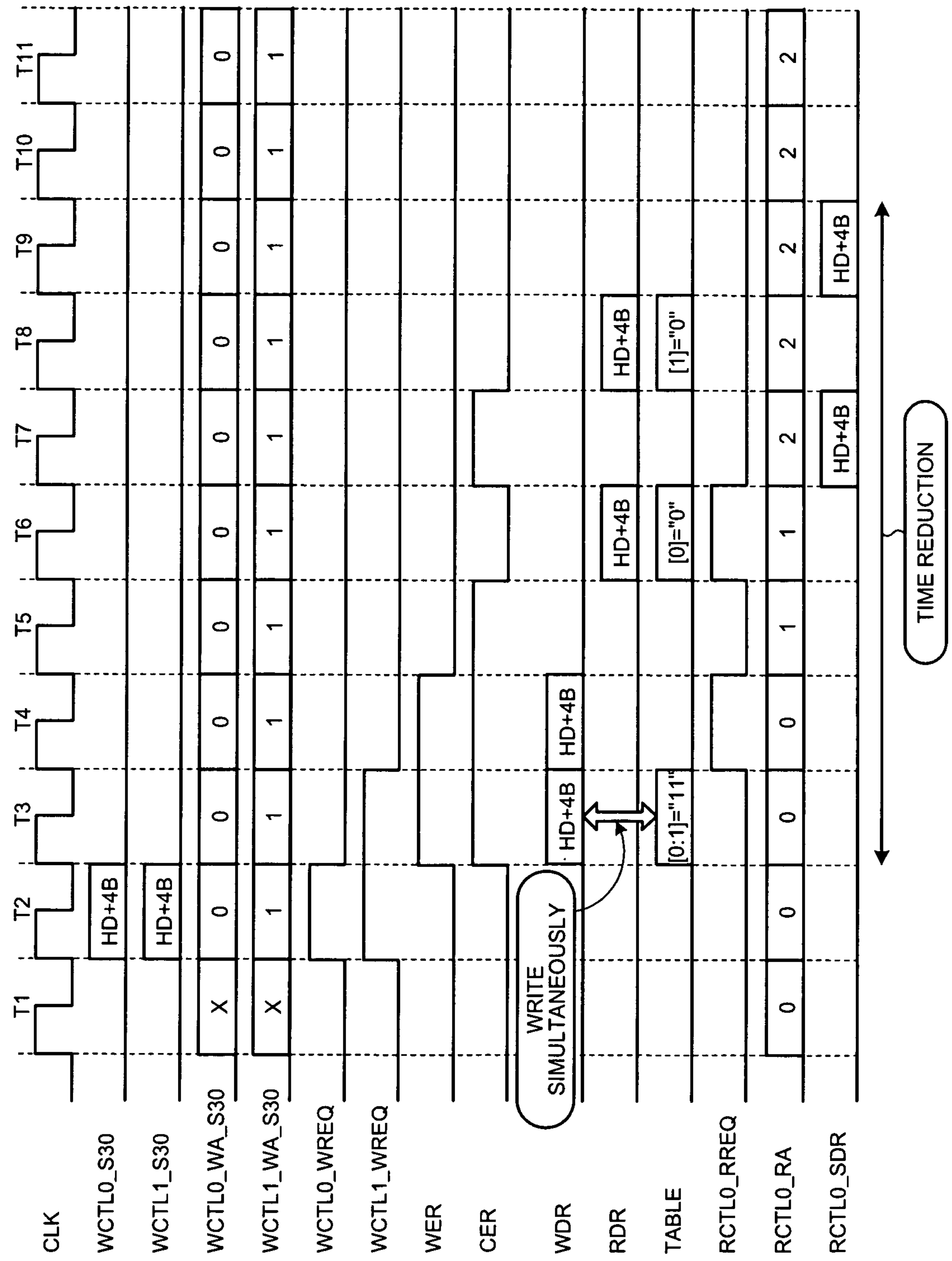
FIG. 2 is a drawing for explaining general outlines and features of the data read-and-write controlling device according shown in FIG. 1.

First, by using FIGS. 1 and 2, general outlines and features of the data read-and-write controlling device 10 are explained. FIG. 1 is a block diagram of the structure of the data read-and-write controlling device 10. FIG. 2 is a drawing for explaining general outlines and features of the data read-and-write controlling device 10.

The data read-and-write controlling device 10 includes a plurality of write controlling units 11 (three in FIG. 1, WCTL0 , WCTL1, WCTL2), a plurality of read controlling units 14, a write enable register (WER) 17, an address data register (ADR) 16, a RAM 19, a write data register (RDR) 20, and a RAM write-information table 21. Data is written in the RAM and simultaneously the address information of the data is written in the RAM write-information table 21. Moreover, data is read from the RAM 19 by referring to the address information written in the RAM write-information table 21.

In the data read-and-write controlling device 10, as depicted in FIG. 2, without waiting for data (HD+4B in FIG. 2) to be written in the RAM 19 (in FIG. 2, at the same time when the values of WE and CE become "1") and simultaneously with writing of the data in the WER 17 and the ADR 16, address information of the data is written in a RAM write-information table ("table" depicted in FIG. 2) 21 (refer to T3 in FIG. 2).

That is, specifically, the data read-and-write controlling device 10 associates the address retained in a data register (WA_S30) of the write controlling unit (WCTL) 11 and the value (a write request is present="1") of a write request WRQ for making a request for writing data to the RAM 19 retained in a write request register (WREQ), and then causes the associated data to be stored in the RAM write-information table 21 as address information (table[0:1]=11 depicted in FIG. 2).

Then, immediately after the address information is written in the RAM write-information table 21, the data read-and-write controlling device 10 reads the data from the RDR 20 by referring to the address information (for example, table[0:1] =11 depicted in FIG. 2).

In this manner, the data read-and-write controlling device 10 writes the address information in the RAM write-information table 21 without the need of confirming that the data is written in the RAM 19. As a result, an improvement in latency can be achieved.

Figure 3:
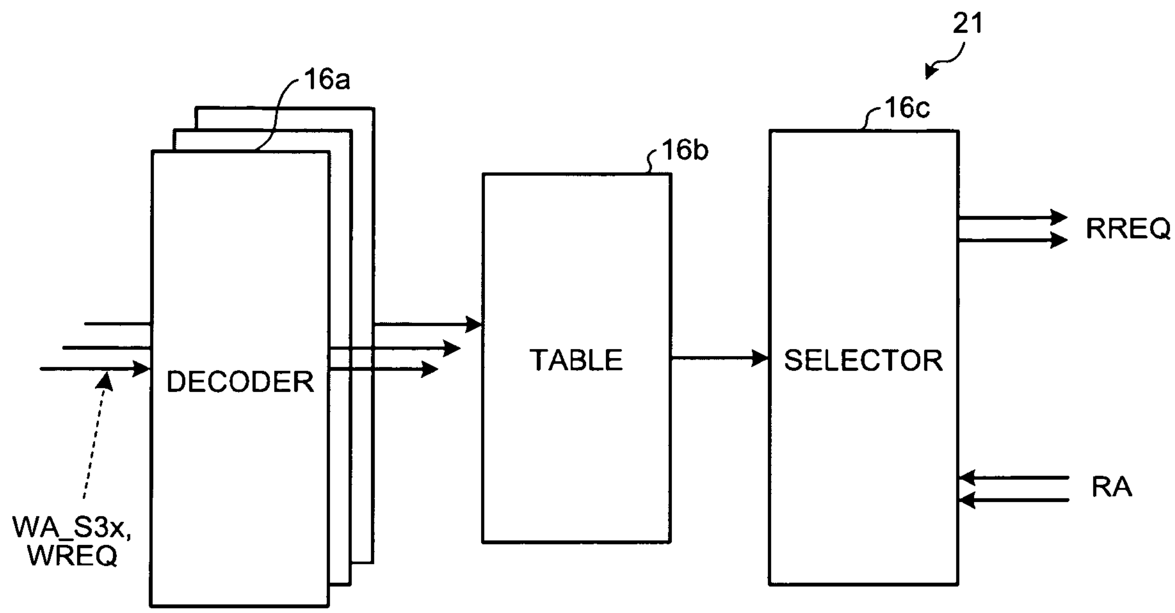
FIG. 3 is a drawing for explaining a RAM write-information table shown in FIG. 1.
Figure 4:
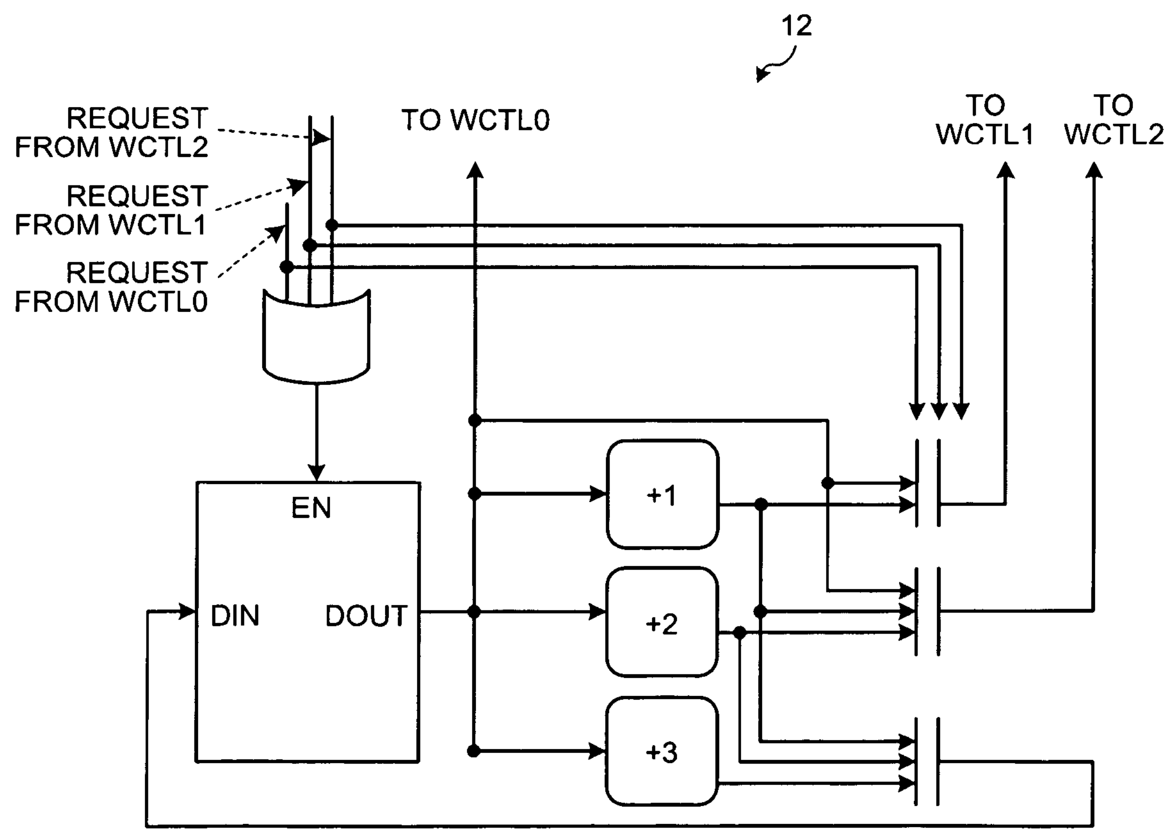
FIG. 4 is a drawing for explaining a circuitry example of an address managing unit shown in FIG. 1.
Figure 7:
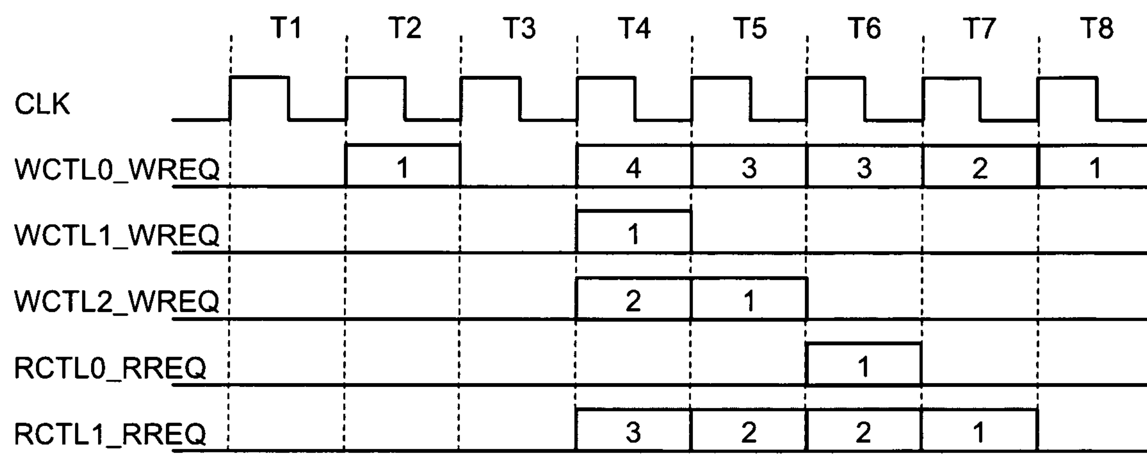
FIG. 7 is a time chart for explaining an access-right assigning process performed by the arbitrating circuit.

Next, the structure of the data read-and-write controlling device 10 is described by using FIGS. 1 and 3 to 6. FIG. 1 is a block diagram of the structure of the data read-and-write controlling device 10. FIG. 3 is a drawing for explaining the RAM write-information table. FIG. 4 is a drawing for explaining a circuitry example of an address managing unit 12 of the data read-and-write controlling device 10. FIG. 5 is a drawing for explaining an operation example of the address managing unit 12. FIG. 6 is a drawing for explaining an operation example of an arbitrating circuit 13 of the data read-and-write controlling device 10. FIG. 7 is a time chart for explaining an access-right assigning process performed by the arbitrating circuit 13.

As depicted in FIG. 1, the data read-and-write controlling device 10 includes the write controlling units 11, the address managing unit 12, the arbitrating circuit 13, the read controlling unit 14, a write data register (WDR) 15, the ADR 16, the WER 17, a clock-enable register (CER) 18, the RAM 19, the RDR 20, and the RAM write-information table 21. The functions of each of these components are explained below. The write controlling units 11 correspond to an "address-information writing unit" in the claims, and the read controlling unit 14 corresponds to a "data reading unit" in the claims.

The WDR 15 is a unit that stores data to be written in the RAM 19. The ADR 16 is a unit that stores therein address information of an address of the RAM 19 where data stored in the WDR 15 is written. The WER 17 is a unit that stores therein the value of WE ("1" for write and "0" for read). The CER 18 is a unit that stores therein the value of CE ("1" for access). The RDR 20 is a unit that stores therein data read from the RAM 19.

The RAM 19 is a unit that stores therein data, specifically, data written by any of the write controlling units 11. The data in the RAM 19 is read by the read controlling unit 14.

The RAM write-information table 21 is a unit that stores therein address information indicative of a write state at each address of the RAM 19. Specifically, the RAM write-information table 21 stores therein a write state at an address of the RAM 19 where write is performed by way of any write controlling unit 11 (for example, table[0]="11" indicating that write of the address "0" of the RAM 19 is completed by way of the write controlling unit 11), and stores therein a write state at an address of the RAM 19 where write is performed by way of the read controlling unit 14 (for example, table[0]="0" indicating that read of the address "0" of the RAM 19 is completed by way of the read controlling unit 14).

A circuitry example of the RAM write-information table 21 is described by using FIG. 3. The RAM write-information table 21 includes a plurality of decoders 16*a* that receive data and WREQ from the write controlling unit 11, a table 16*b* that stores therein address information, and a selector 16*c* that selects address information corresponding to a read address (RA) received by the read controlling unit 14. Because a plurality of the write controlling units 11 may simultaneously update the table 16*b*, a plurality of decoders 16*a* are required for the respective write controlling units 11.

The decoders 16*a* receive an address (for example, "0") input by the write controlling unit 11 and the value of WREQ (a write request is present ="1", associates the address and the WREQ information with each other, and then stores the result in the table 16*b* as address information (for example, [0:1]=11). The selector 16*c* receives an RA from the read controlling unit 14, selects a write state (for example, "1" indicative of the completion of write) from the address information (table[0]="1") corresponding to the RA (for example "0"), and then outputs the write state as RREQ to the read controlling unit 14.

Referring back to FIG. 1, each write controlling unit 11 includes a plurality of data registers (S1, S20, S21, S30, WREQ, and WA_S30) and is a unit that writes data in the RAM 19. Specifically, the registers S1 receive input data (HD and 4B) input from outside, and inputs the received data to the registers S30 via the registers S20 and S21. Then, when S30 retains data, the write controlling unit 11 acquires from the address managing unit 12 a write address (WA) which area the data is to be written in the RAM 19 (for example, WA_S30="0"), sets WREQ=1 indicating that a request for writing data in the RAM 19 is present, and notifies the arbitrating circuit 13 of WREQ=1 (write request).

Figure 11:
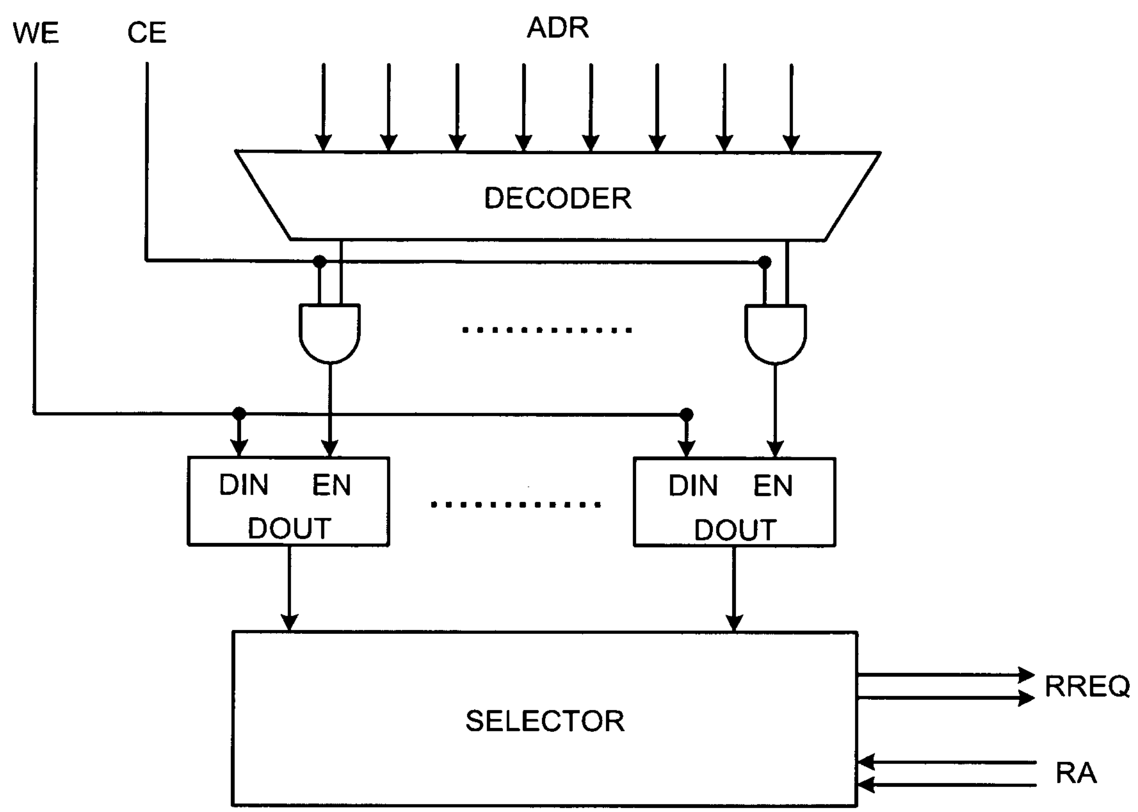
FIG. 11 is a structural diagram of a RAM write-information table shown in FIG. 10.
Figure 12:
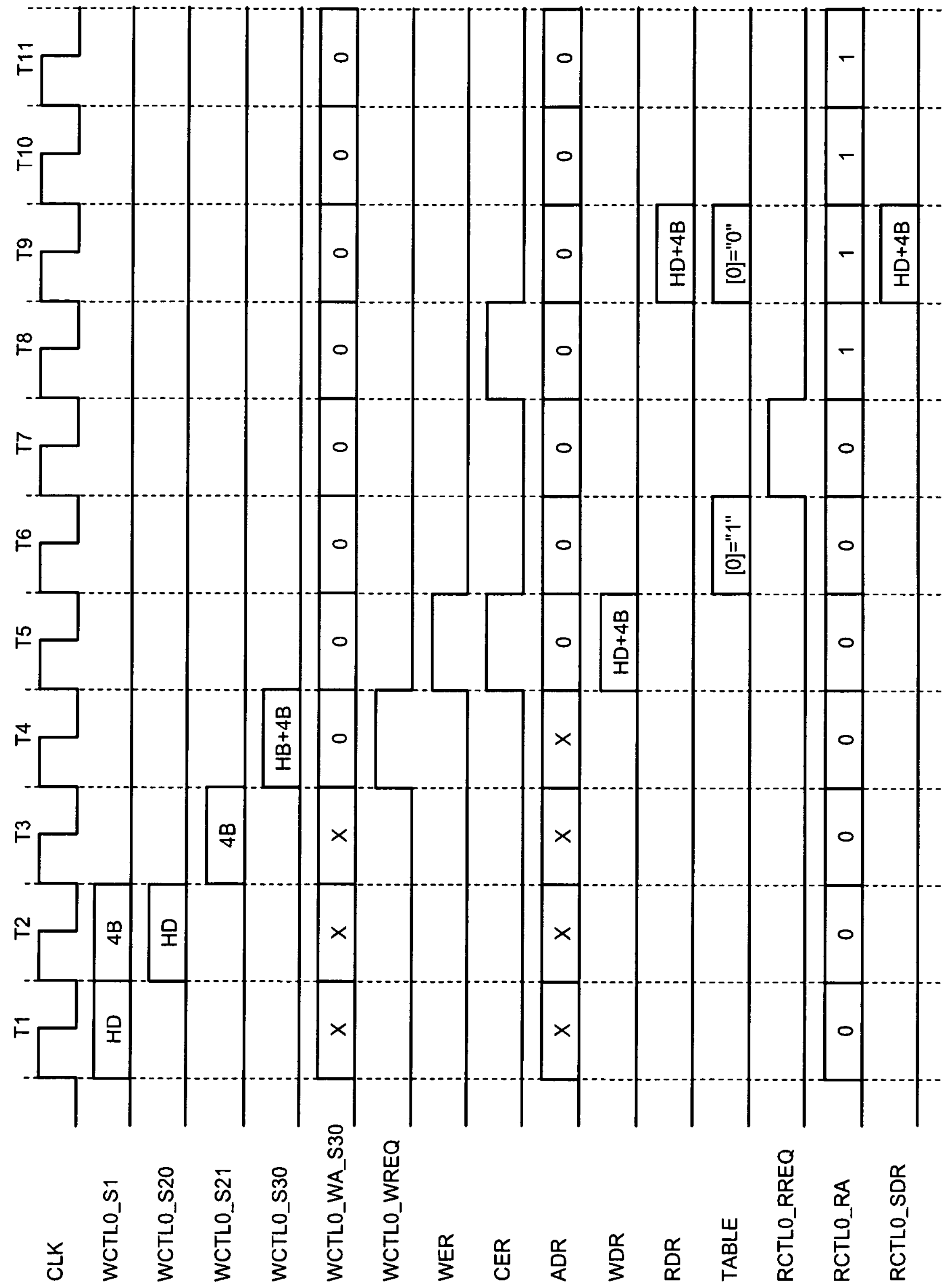
FIG. 12 is a time chart of a process flow of the conventional RAM read-and-write controlling device when data is input to a write controlling unit.
Figure 13:
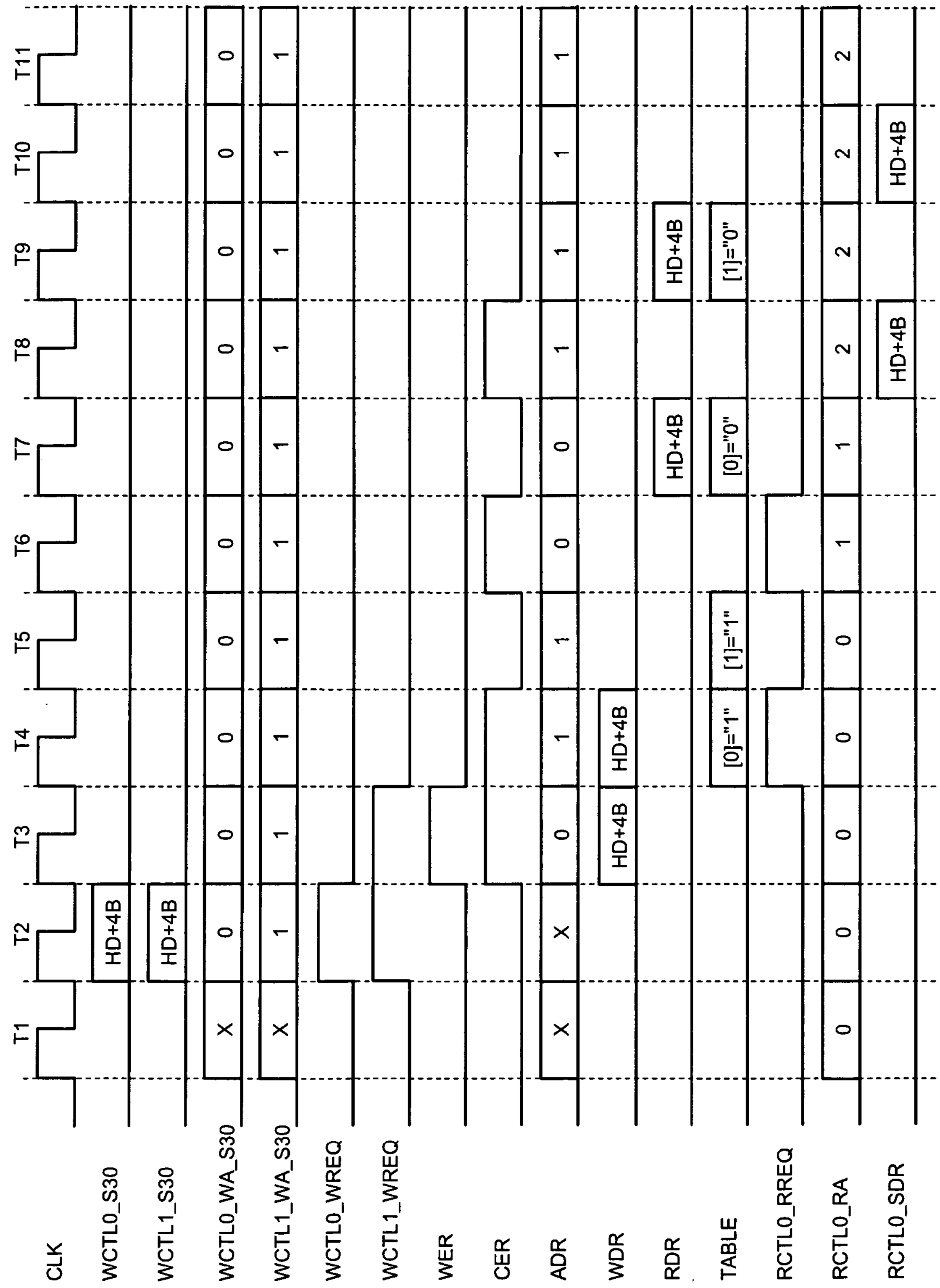
FIG. 13 is a time chart of a process flow of the conventional RAM read-and-write controlling device when data is simultaneously input to a plurality of write controlling units.

The write controlling unit 11 then writes the address information (for example, [0:1]=11 depicted in FIG. 11) in the RAM write-information table 21. Also, when assigned with an access right by the arbitrating circuit 13, the write controlling unit 11 writes an address in the ADR 16, and writes the data (HD+4B) in the WDR 15.

The address managing unit 12 is a unit that performs address management and assigns an address, which is a unique number, to data received by the write controlling unit 11 from outside. Here, by using FIGS. 4 and 5, the address managing unit 12 is explained in detail.

As depicted in FIG. 4, upon receiving from the write controlling unit 11 a signal requesting for assignment of an address the address managing unit 12, the address managing unit 12 notifies of the address to the write controlling unit 11 issuing that request of the address, and adds to the address number by the number of times of request. This addition process is explained by using FIG. 5. As depicted in FIG. 5, every time notification of an address is issued, "1" is added to the address number of the address of which notification is to be issued next. For example, as depicted in FIG. 5 by way of example, when address requests are received simultaneously from WCTL0 and WCTL1, an WCTL0 is notified of an address (return value to WCTL0 is "DOUT"), and an address with 1 added to the notified address (return value to WCTL0 is "DOUT+1"). Then, because notification of two addresses has been made, 2 is added to the address number for notification next (DIN"DOUT+2").

Referring back to FIG. 1, the arbitrating circuit 13 is a unit that receives a write request (WREQ=1) from the write controlling unit 11, or a read request (WREQ=1) from the read controlling unit 14, and then assigns to the request an access right to the RAM 19. The arbitrating circuit 13 is described in detail by using FIGS. 6 and 7.

As depicted in FIG. 6, the arbitrating circuit 13 determines priority so that the rank of the request that acquires an access right to the RAM 19 coming the lowest next time at last, and sequentially assigns an access right to the requests according to the priority. For example, as depicted in FIG. 7, the arbitrating circuit 13 gives an access right to the register WCTL0_WREQ at T2, and when requests come at T4 simultaneously from WCTL0_WREQ, WCTL1_WREQ, WCTL2_WREQ, and RCTL1_RREQ, assigns an access right in the fourth and lowest rank of priority to WCTL0_WREQ.

Referring back to FIG. 1, the read controlling unit 14 is a unit that includes a plurality of registers (RREQ, RA, and SDR) and reads data from the RAM 19 by referring to the address information stored in the RAM write-information table 21. Specifically, the read controlling unit 14 notifies the RAM write-information table 21 of a read address (for example, RA="0") indicating from which address in the RAM 19 data is to be read, selects a write state (for example, "1" indicating the completion of write) based on the address information corresponding to the read address, and then obtains the write state as RREQ at the read controlling unit 14.

The read controlling unit 14 then notifies the arbitrating circuit 13 of the value of the received RREQ (a read request is present =[1]) as a read request. When an access right is assigned by the arbitrating circuit, the read controlling unit 14 reads data from the RDR 20, stores the data in the register SDR, and then sends it outside. The read controlling unit 14 adds 1 to the value of RA every time an access right is assigned from the arbitrating circuit 13 to RREQ.

Figure 8:
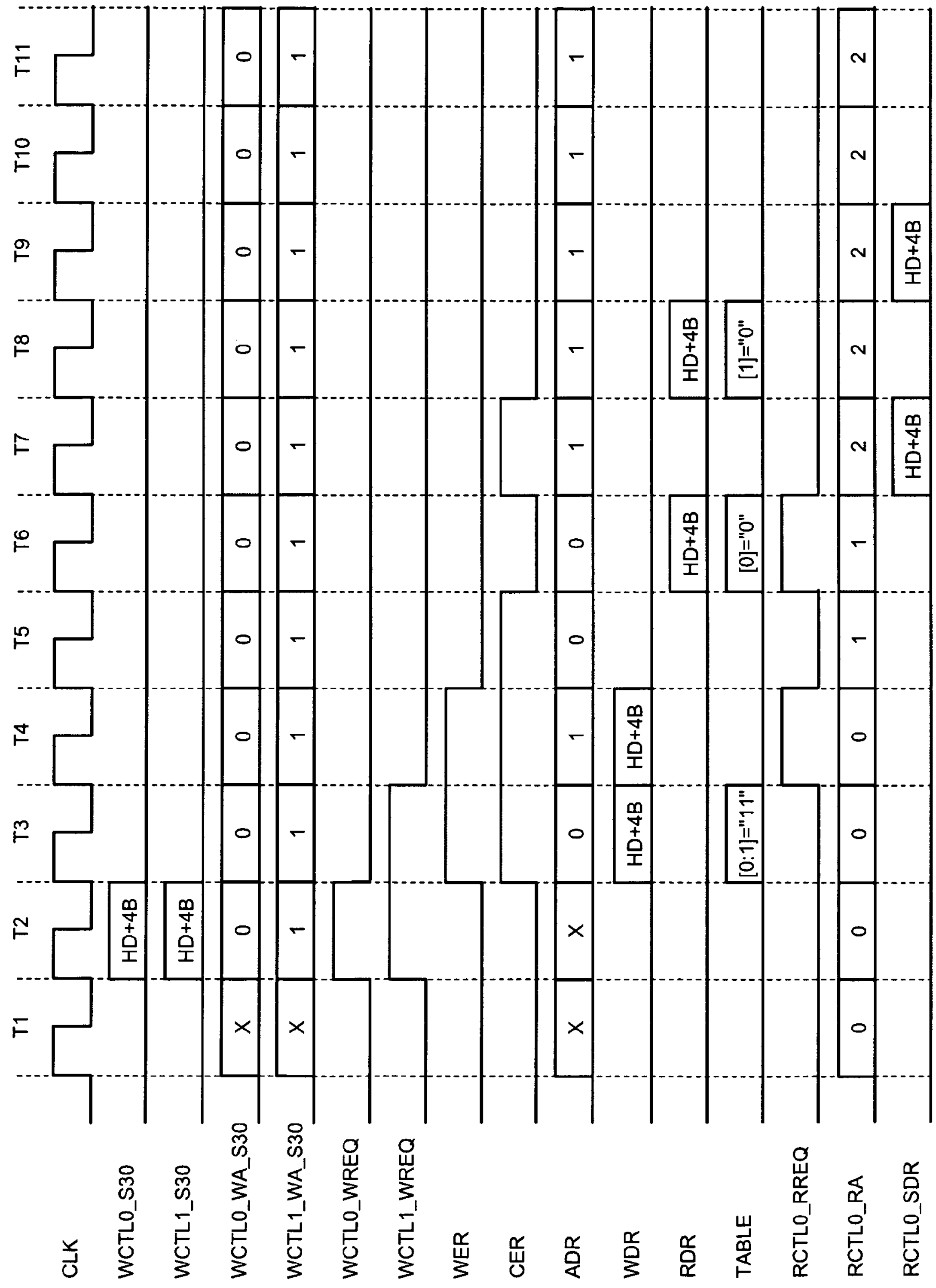
FIG. 8 is a time chart of a process flow of the data read-and-write controlling device shown in FIG. 1 when data is simultaneously input to a plurality of write controlling units.

Next, the operation performed by the data read-and-write controlling device 10 is explained by using FIG. 8. FIG. 8 is a time chart of a process flow of the data read-and-write controlling device 10 when data is simultaneously input to the write controlling units WCTL0 and WCTL1.

As depicted in the drawing, after data is input simultaneously to the write controlling units WCTL0 and WCTL1, at timing of T2, the data read-and-write controlling device 10 stores each piece of the input data (HD+4B) in both the registers WCTL0_S30 and WCTL1_S30, and stores address information ("0" and "1") obtained from the address managing unit 12 in both the registers WCTL0_WA_S30 and WCTL1_WA_S30. Also, at timing T3, the data read-and-write controlling device 10 sets both the registers WCTL0_WREQ and WCTL1_WREQ at "1" each, and inputs a write request in the arbitrating circuit 13.

At timing T3, in the data read-and-write controlling device 10, the write controlling units WCTL0 and WCTL1 write address information (for example, [0:1]=11 as depicted in FIG. 1) in the RAM write-information table 21. Also, at timing T3, after an access right is assigned by the arbitrating circuit 13 to the register WCTL0_WREQ, the data read-and-write controlling device 10 writes an address "0" in the ADR 16, writes the data (HD+4B) in the WDR 15 and, furthermore at the same time, sets the value of the WER 17 and the value of the CER 18 at "1" each (refer to T3 in FIG. 8).

Then, at timing T4, the data read-and-write controlling device 10 writes, in the RAM 19, the data "HD+4B" retained in the WDR 15 in the address "0" stored in the ADR 16. Also at timing T4, after an access right is assigned by the arbitrating circuit 13 to WCTL1_WREQ, the data read-and-write controlling device 10 writes in the ADR 16 the address "1" stored in WCTL1_WA_S30 and writes in the WDR 15 the data "HD+4B" stored in WCTL1_S30. Furthermore, the read controlling unit 14 refers to the RAM write-information table to set RREQ=1.

At timing T5, the data read-and-write controlling device 10 writes, at the address "1" of the RAM 19 indicated by the ADR 16, the data "HD+4B" stored in the WDR 15. Also, after an access right is assigned from the arbitrating circuit 13 to RCTL0_RREQ, the data read-and-write controlling device 10 adds 1 to the value "0" of RA to set the value of RA at "1".

At timing T6, the data read-and-write controlling device 10 reads in the RDR 20 the data "HD+4B" stored at the address "0" in the RAM 19, and updates the RAM write-information table to [0]="0". The read controlling unit 14 refers to the RAM write-information table to set RREQ=1.

At timing T7, the data read-and-write controlling device 10 sets the value of the CER 18 at "1", notifies the ADR 16 from RA of the address "1" of data to be read from the RAM 19, and adds 1 to "0" to set "1", which is a value of RA. Also, at timing T7, in the data read-and-write controlling device 10, the read controlling unit 14 reads the data "HD+4B" stored in the RDR 20 for storage in the SDR, and then the data is sent to the outside.

At timing T8, the data read-and-write controlling device 10 reads in the RDR 20 the data "HD+4B" stored at an address "1" in the RAM 19, and updates the RAM write-information table 21 to [1]="0".

At timing T9, in the data read-and-write controlling device 10, the read controlling unit 14 reads the data "HD+4B" stored in the RDR 20 for storage in the SDR, and then the data is sent to the outside.

As explained above, based on the write request for making a request for writing data in the RAM 19, the address information of that data is written in the RAM write-information table 21. Immediately after the address information is written in the RAM write-information table 21, the address information is referred to and the data is read from the RAM 19. Therefore, a read request can be issued before it is confirmed that data is written in the RAM 19. As a result, there is no need to wait for read until data is written, thereby making it possible to achieve an improvement in latency.

The present invention can be implemented in various other manners than the first embodiment. The present invention can be implemented, for example, as described below as a second embodiment of the present invention. The general outlines and features, structure, and a process flow of a data read-and-write controlling device according to the second embodiment is substantially the same as that of the data read-and-write controlling device 10 according to the first embodiment.

In the first embodiment, the case has been explained in which priority is determined without distinguishing between the write request and the read request. The priority can be determined by assigning a higher priority to the write request than to the read request.

A priority determining process according to the second embodiment is specifically explained below by using FIG. 9.

Figure 9:
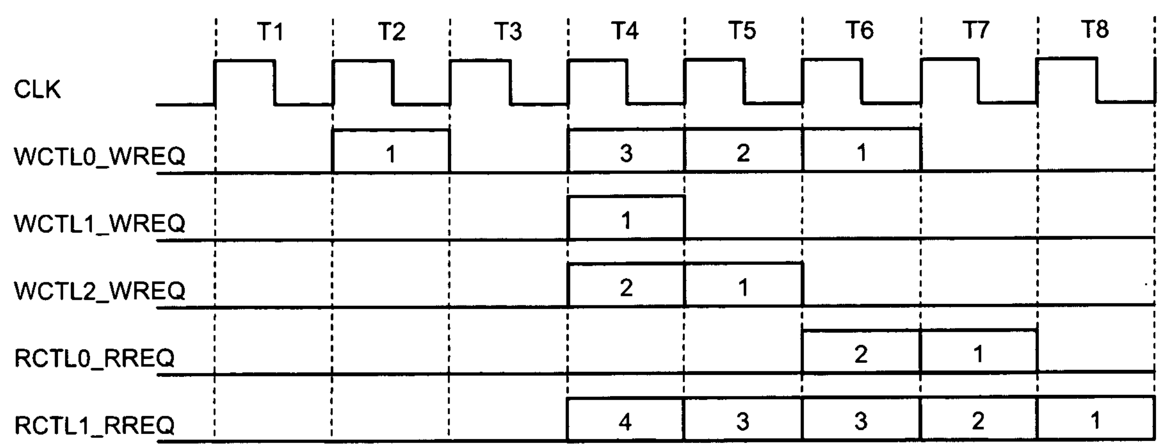
FIG. 9 is a time chart for explaining an access-right assigning process performed by the arbitrating circuit shown in FIG. 1.
Figure 10:
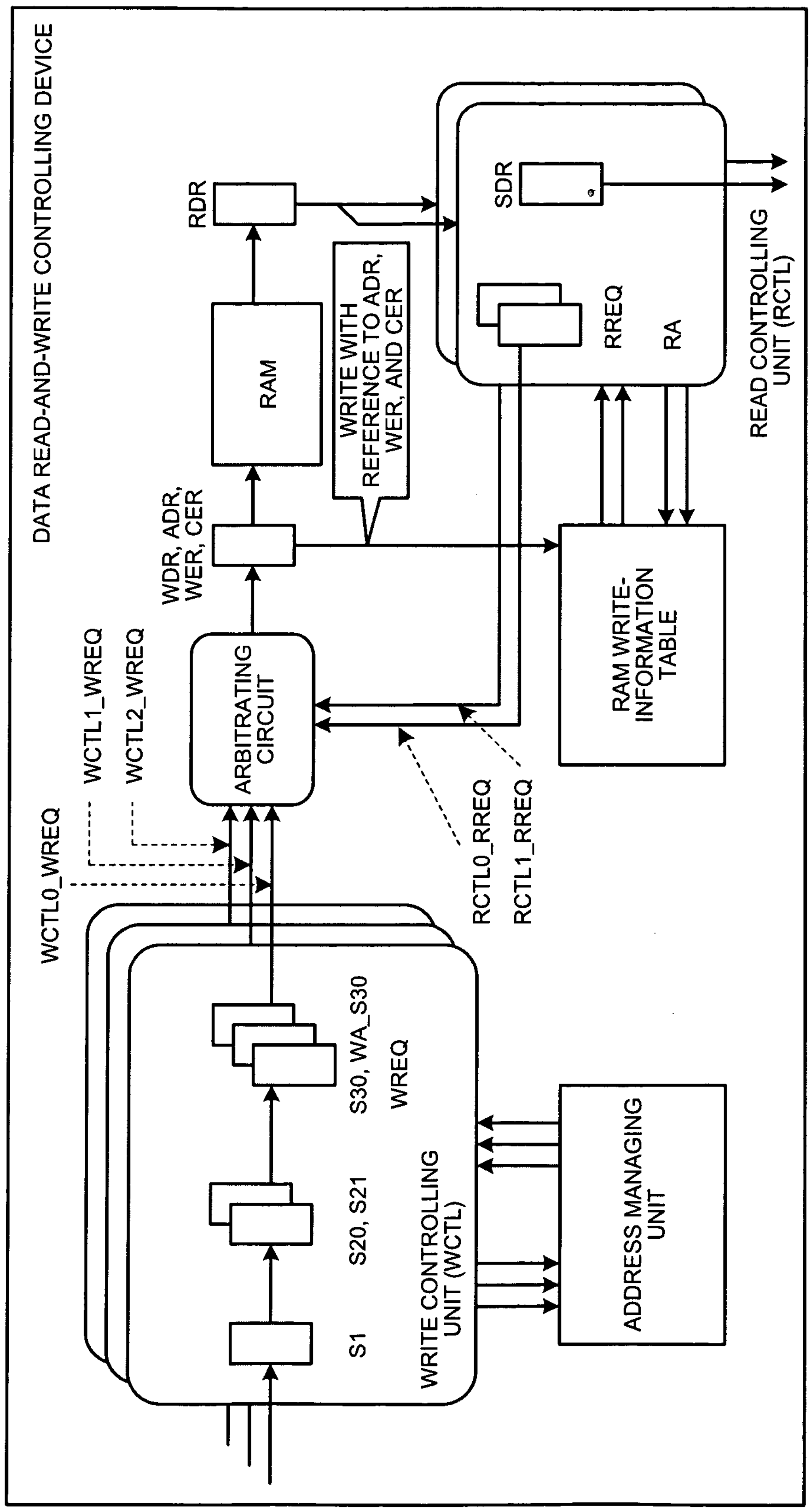
FIG. 10 is a block diagram of the structure of a conventional RAM read-and-write controlling device.

As depicted in FIG. 9, after the arbitrating circuit 13 gives an access right to WCTL0_WREQ at T2, when requests simultaneously come from WCTL0_WREQ, WCTL1_WREQ, WCTL2_WREQ, and RCTL1_RREQ, the arbitrating circuit 13 assigns first to third access rights to WCTL1_WREQ, WCTL2_WREQ, and WCTL0_WREQ, respectively, and also assigns a fourth access right lowest in priority to RCTL1_RREQ.

In this manner, when a plurality of data write requests and read requests for the RAM 19 are received, these requests are arbitrated so that the write requests are processed with priority over the read requests. Thus, it is possible to prevent data from being read from the RAM write-information table 21 before the address information is written in the RAM write-information table 21.

Each of the components of the data read-and-write controlling device depicted in the drawings represents a functional concept, and is not necessarily physically configured as depicted in the drawings. That is, specific distribution/unification forms of the components are not restricted to those depicted in the drawings. All or part of the components can be configured so as to be functionally or physically distributed/unified in arbitrary units according to various loads and the use state. For example, the write controlling units 11 and the address managing unit 12 may be combined in one unit. Furthermore, each processing function implemented in each component can be achieved by a CPU and a program interpreted and executed at the CPU, or can be achieved as hardware with wired logics.

Furthermore, among the processes explained in the embodiments, those explained as being automatically performed can be manually performed in part or in entirety. Also, those explained as being manually performed can be automatically performed in part or in entirety through a known method. Furthermore, information including the process procedures, the control procedures, the specific names, and various data and parameter explained herein and depicted in the drawings can be arbitrarily changed unless otherwise specified.

Here, the data read-and-write controlling method explained in the above embodiments can be achieved by executing a previously-provided computer program on a computer. The computer can be a personal computer or a work station. This computer program can be distributed over a network, such as the Internet. Also, this computer program is conducted to be recorded on a computer-readable recording medium, such as a hard disk, flexible disk (FD), compact-disk read only memory (CD-ROM), magneto-optical (MO) disk, or a digital versatile disk (DVD), and is read from the recording medium by the computer.

According to an aspect of the present invention, a read request is issued before it is confirmed that data is written in a predetermined storage unit. As a result, there is no need to wait for read until data is written, thereby making it possible to achieve an improvement in latency. Moreover, it is possible to prevent data from being read from the table before the address data is written in the table.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A memory controller for controlling a memory that stores data in a write address based on a write request, the memory controller comprising:

a register that holds a write request and a write address, and outputs the held write request and the held write address to the memory;

a write information table that stores therein write information per write address, the write information indicating whether data is stored in the memory;

an address managing unit that generates a write address based on a write request received; and a write controlling unit that outputs the received write request to the address managing unit, and when the write controlling unit inputs the write address generated by the address managing unit, the write controlling unit outputs a write instruction that is based on the received write request and the generated write address to the write information table, and at the same time outputs the received write request and the generated write address to the register.

2. The memory controller according to claim 1, further comprising:

a read controlling unit that generates a read address and outputs the generated read address to the write information table, and outputs a read request and the generated read address to the memory, the read request being generated by the write information table and being based on the generated read address.

3. The memory controller according to claim 2, further comprising:

a plurality of write controlling units; and an arbitrating unit that arbitrates a plurality of write requests outputted by the plurality of write controlling units, and outputs an arbitrated write request, a write address and data that correspond to the arbitrated write request to the memory.

4. The memory controller according to claim 3, further comprising:

a plurality of read controlling units, wherein the arbitrating unit arbitrates a plurality of read requests outputted by the plurality of read controlling units, and outputs an arbitrated read request and a read address that correspond to the arbitrated read request to the memory.

5. The memory controller according to claim 4, wherein the arbitrating unit arbitrates the plurality of read requests being for data stored in the memory based on a write request by giving a priority to the plurality of write requests over the plurality of read requests when the arbitrating unit respectively inputs the plurality of write requests from the plurality of write controlling units and the plurality of read requests from the read controlling units.

6. The memory controller according to claim 3, wherein the arbitrating unit arbitrates a new write request outputted from the plurality of write controlling units by giving the lowest priority to the new write request when the arbitrating unit inputs the new write request from a write controlling unit from which a write request is outputted and arbitrated the last time among the write controlling units.

7. The memory controller according to claim 1, wherein the address managing unit generates a plurality of addresses that are mutually different by increasing a value of a write address every time inputting a write request.

8. A controlling method for a memory controller for controlling a memory that stores data in a write address, the memory controller including a register that holds a write request and a write address, and outputs the held write request and the held write address to the memory, and a write information table that stores therein write information per the write address, the write information indicating that data is stored in the memory, the controlling method comprising:

generating a write address based on a write request received by an address managing unit included in the memory controller;

outputting the received write request to the address managing unit by a write controlling unit included in the memory controller;

outputting a write instruction that is based on the received write request and the write address generated by the address managing unit to the write information table, and the received write request and the generated write address to the register at the same time by the write controlling unit when the write controlling unit inputs the generated write address.

* * * * *